(12) United States Patent
Kim et al.

(10) Patent No.: US 11,528,440 B2
(45) Date of Patent: Dec. 13, 2022

(54) DIGITAL PIXEL SENSOR AND ANALOG DIGITAL CONVERTER

(71) Applicant: SAMSUNG ELECTRONICS CO., LTD., Suwon-si (KR)

(72) Inventors: Sung Yong Kim, Hwaseong-si (KR); Myung Lae Chu, Hwaseong-si (KR); Min Woong Seo, Hwaseong-si (KR); Jun An Lee, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/497,558

(22) Filed: Oct. 8, 2021

(65) Prior Publication Data

US 2022/0191419 A1    Jun. 16, 2022

(30) Foreign Application Priority Data

Dec. 15, 2020 (KR) .................. 10-2020-0174994

(51) Int. Cl.
| | |
|---|---|
| *H04N 5/376* | (2011.01) |
| *H04N 5/374* | (2011.01) |
| *H04N 5/369* | (2011.01) |
| *H04N 5/378* | (2011.01) |
| *H03M 1/56* | (2006.01) |
| *H03M 1/82* | (2006.01) |
| *H04N 5/3745* | (2011.01) |
| *H04N 5/365* | (2011.01) |

(52) U.S. Cl.
CPC .......... *H04N 5/37455* (2013.01); *H03M 1/56* (2013.01); *H04N 5/3655* (2013.01); *H04N 5/3765* (2013.01); *H04N 5/37452* (2013.01)

(58) Field of Classification Search
CPC ........ H03M 1/56; H03M 1/825; H04N 5/365; H04N 5/37455; H04N 5/3655; H04N 5/3694; H04N 5/37452; H04N 5/378; H04N 5/379

See application file for complete search history.

(56) References Cited

U.S. PATENT DOCUMENTS

| | | |
|---|---|---|
| 10,136,090 B2 | 11/2018 | Vogelsang et al. |
| 10,594,973 B2 | 3/2020 | Vogelsang et al. |
| 10,609,318 B2 | 3/2020 | Sakakibara et al. |
| 10,652,493 B2 | 5/2020 | Ladd et al. |
| 10,652,531 B2 | 5/2020 | Kono et al. |
| 10,680,032 B2 | 6/2020 | Kawahito |
| 2006/0220939 A1* | 10/2006 | Kirsch .................. H03M 1/12 341/155 |

(Continued)

*Primary Examiner* — Marly S Camargo
(74) *Attorney, Agent, or Firm* — Sughrue Mion, PLLC

(57) ABSTRACT

A digital pixel sensor for correcting and reducing a mismatch between a pixel and an analog digital converter provided. The digital pixel sensor includes a pixel array including a plurality of pixels; and a bank disposed on the pixel array. The bank includes: a plurality of comparators disposed on the plurality of pixels and configured to compare each of a plurality of pixel signals output from the plurality of pixels with a reference signal to output a plurality of comparison result signals; and a counter connected to the plurality of comparators, and configured to receive the plurality of comparison result signals and latch count code based on the plurality of comparison result signals.

21 Claims, 17 Drawing Sheets

(56) References Cited

U.S. PATENT DOCUMENTS

| | | | |
|---|---|---|---|
| 2012/0113286 A1* | 5/2012 | Lin | H04N 5/228 348/222.1 |
| 2015/0163403 A1* | 6/2015 | Wakabayashi | H04N 5/23241 |
| 2016/0366359 A1* | 12/2016 | Lee | H04N 5/378 |
| 2017/0237914 A1* | 8/2017 | Cho | H04N 5/3574 |
| 2018/0359441 A1* | 12/2018 | Luo | H04N 5/378 |
| 2020/0186732 A1 | 6/2020 | Takizawa et al. | |
| 2020/0374474 A1* | 11/2020 | Lee | H04N 5/369 |
| 2022/0116565 A1* | 4/2022 | Tsai | H04N 5/37455 |

\* cited by examiner

DIGITAL PIXEL SENSOR AND ANALOG DIGITAL CONVERTER

CROSS-REFERENCE TO RELATED APPLICATION

This application is based on claims priority under 35 U.S.C. § 119 to Korean Patent Application No. 10-2020-0174994 filed on Dec. 15, 2020 in the Korean Intellectual Property Office, the disclosure of which is incorporated by reference herein in its entirety.

BACKGROUND

1. Technical Field

The disclosure relates to an image sensor and an image sensing system including the image sensor.

2. Description of the Related Art

An image sensing device is one of the semiconductor devices that convert optical information into electrical signals. Examples of the image sensing device may include a charge coupled device (CCD) image sensing device and a complementary metal oxide semiconductor (CMOS) image sensing device.

A CMOS type image sensor may be abbreviated as CIS. The CIS may include a plurality of pixels arranged two-dimensionally. Each of the pixels may include, for example, a photodiode (PD). The photodiode may serve to convert incident light into an electrical signal.

In recent years, with the development of the computer industry and the telecommunications industry, demands for image sensors with improved performance have been increased in various fields, such as digital cameras, camcorders, smartphones, game devices, security cameras, medical micro cameras, robots, and the like.

SUMMARY

Aspects of the present disclosure provide a digital pixel sensor in which a mismatch between a pixel and an analog digital converter is reduced.

Aspects of the present disclosure also provide a digital pixel sensor with improved performance by decreasing noise.

Aspects of the present disclosure also provide a digital pixel sensor with a reduced size.

Aspects of the present disclosure also provide an analog digital converter with improved performance by decreasing noise.

However, aspects of the present disclosure are not limited to those set forth herein. The above and other aspects of the present disclosure will become more apparent to one of ordinary skill in the art to which the present disclosure pertains by referring to the detailed description of the present disclosure provided below.

According to an embodiment, there is provided a digital pixel sensor including: a pixel array including a plurality of pixels; and a bank disposed on the pixel array. The bank includes: a first comparator disposed on a first pixel of the plurality of pixels and configured to compare a first pixel signal output from the first pixel with a reference signal to output a first comparison result signal; a second comparator disposed on a second pixel of the plurality of pixels and configured to compare a second pixel signal output from the second pixel with the reference signal to output a second comparison result signal; a third comparator disposed on a third pixel of the plurality of pixels and configured to compare a third pixel signal output from the third pixel with the reference signal to output a third comparison result signal; a fourth comparator disposed on a fourth pixel and configured to compare a fourth pixel signal output from the fourth pixel with the reference signal to output a fourth comparison result signal; and a counter connected to a plurality of comparators including the first comparator to the fourth comparator, and configured to receive a plurality of comparison signals including the first comparison result signal to the fourth comparison result signal, and latch count code based on the plurality of comparison result signals.

According to an embodiment, there is provided a digital pixel sensor including: a pixel array including a first pixel configured to output a first pixel signal and a second pixel configured to output a second pixel signal different from the first pixel signal; and a bank disposed on the pixel array. The bank includes: a first comparator configured to perform analog signal processing on the first pixel signal to output a first analog signal; a second comparator configured to perform digital signal processing on the first analog signal to output a first comparison result signal; a third comparator configured to perform the analog signal processing on the second pixel signal to output a second analog signal; a fourth comparator configured to perform the digital signal processing on the second analog signal to output a second comparison result signal; and a counter configured to latch count code based on the first comparison result signal and the second comparison result signal, wherein the first comparator to the fourth comparator are disposed in a first direction, and the counter is disposed adjacent to the first comparator to the fourth comparator in a second direction intersecting the first direction.

According to an embodiment, there is provided an analog digital converter including: a comparator configured to compare a reference signal with a pixel signal output from a pixel and output a comparison result signal; a count code generator configured to receive a code generation clock signal from a clock signal generator, and output first count code and second count code according to the code generation clock signal; a first memory configured to latch the first count code based on a reset component of the comparison result signal during a first time period; and a second memory configured to latch the second count code based on an image signal component of the comparison result signal during a second time period subsequent to the first time period, wherein, during a third time period subsequent to the second time period, the first count code is read from the first memory, and during a fourth time period subsequent to the third time period, the second count code is read from the second memory.

BRIEF DESCRIPTION OF THE DRAWINGS

The above and other aspects, features and advantages of the present disclosure will become more apparent from the following description taken in conjunction with the accompanying drawings, in which.

DETAILED DESCRIPTION

Hereinafter, embodiments according to the inventive concept of the present disclosure will be described with reference to the accompanying drawings.

Figure 1:
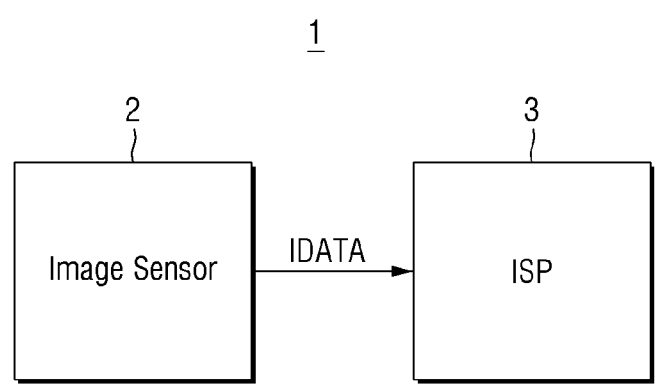
FIG. 1 is a block diagram of an image sensing system according to an embodiment.

FIG. 1 is a block diagram of an image sensing system according to an embodiment.

Referring to FIG. 1, an image sensing system 1 may include an image sensor 2 and an image signal processor (ISP) 3.

The image sensor 2 may be connected to the image signal processor 3 and provide image data IDATA to the image signal processor 3. The image signal processor 3 may receive the image data IDATA from the image sensor 2 and perform image processing on the image data IDATA. Here, the image signal processor 3 is illustrated as being arranged separately from the image sensor 2, but the embodiments of the disclosure are not limited thereto. For example, the image signal processor 3 may be included in the image sensor 2 and perform image processing on the image data IDATA.

Figure 2:
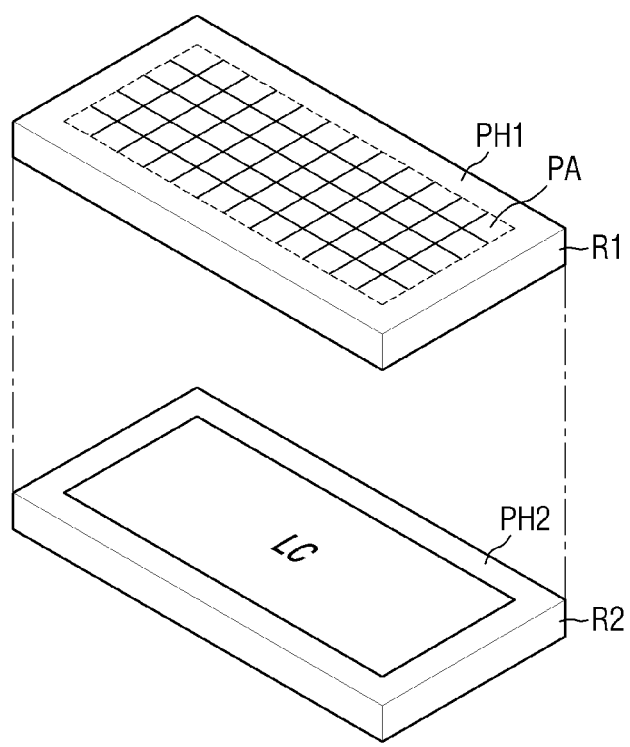
FIG. 2 is a diagram illustrating a conceptual layout of an image sensor according to an embodiment.

FIG. 2 is a diagram illustrating a conceptual layout of an image sensor according to an embodiment.

Referring to FIG. 2, the image sensor 2 may include a first region R1 and a second region R2 stacked in a first direction (e.g., vertical direction). As illustrated, the first region R1 and the second region R2 may extend in a second direction and a third direction that intersect the first direction (e.g., the second direction and the third direction being perpendicular to the first direction), and components of the image sensor 2 may be disposed in the first region R1 and the second region R2.

Although not shown in the drawings, a third region in which a memory is arranged may be disposed under the second region R2. Here, the memory disposed in the third region may receive image data IDATA from the first region R1 and the second region R2, store or process the image data, and retransmit the image data to the first region R1 and the second region R2. The memory may include a memory element, such as a dynamic random access memory (DRAM), a static random access memory (SRAM), a spin transfer torque magnetic random access memory (STT-MRAM), and a flash memory. When the memory includes, for example, a DRAM, the memory may receive and process the image data at a relatively high speed. Further, in some embodiments, the memory may be disposed in the second region R2.

The first region R1 may include a pixel array area PA and a first peripheral area PH1, and the second region R2 may include a logic circuit area LC and a second peripheral area PH2. The first region R1 and the second region R2 may be sequentially stacked vertically.

In the first region R1, the pixel array area PA may include a pixel array 100 which will be described later. The pixel array 100 may include a plurality of unit pixels arranged in a matrix. Each pixel may include a photodiode and transistors.

The first peripheral area PH1 may include a plurality of pads and may be disposed around the pixel array area PA. The pads may transmit/receive electrical signals to/from the external device.

In the second region R2, the logic circuit area LC may include electronic elements having a plurality of transistors. The electronic elements included in the logic circuit area LC may be electrically connected to the pixel array area PA to provide a constant signal to each unit pixel of the pixel array area PA or control the output signal.

Also, in the second region R2, the second peripheral area PH2 may be disposed in an area corresponding to the first peripheral area PH1 of the first region R1, but embodiments are not limited thereto.

Figure 3:
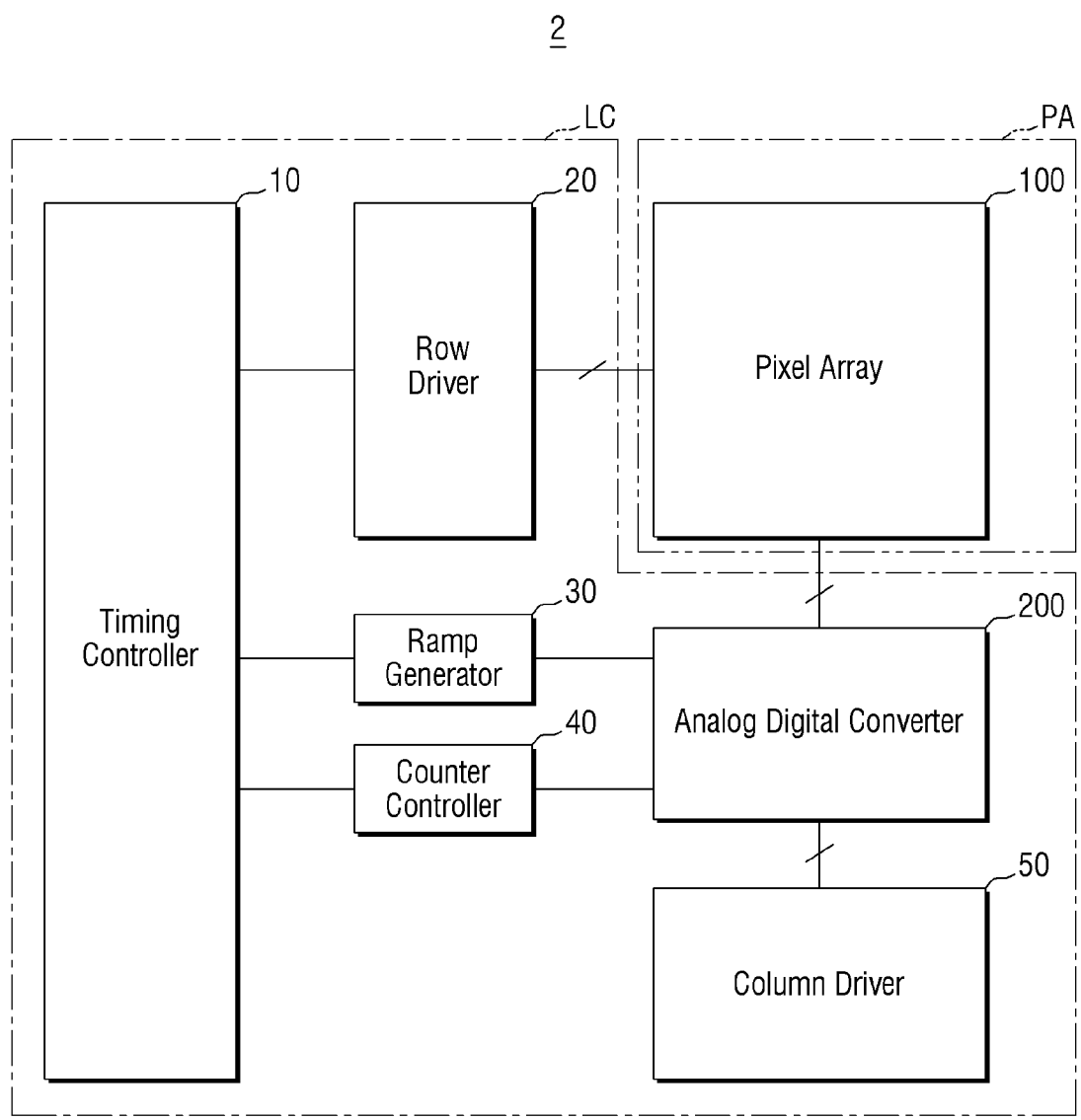
FIG. 3 is a block diagram illustrating an image sensor according to an embodiment.

FIG. 3 is a block diagram illustrating an image sensor according to an embodiment.

Referring to FIG. 3, the image sensor 2 may include a timing controller 10, a row driver 20, a ramp generator 30, a counter controller 40, a column driver 50, an analog digital converter 200, and the like, which may be disposed in the logic circuit area LC. For example, the blocks other than the pixel array 100 may be disposed in the logic circuit area LC.

Referring to FIG. 3, the image sensor 2 may include the pixel array area PA and the logic circuit area LC. The pixel array area PA and the logic circuit area LC may be respectively included in the first region R1 and the second region R2 described above. The pixel array area PA may perform analog signal processing on an analog signal. The logic circuit area LC may perform analog signal processing and digital signal processing on the analog signal received from the pixel array area PA.

The pixel array area PA may include the pixel array 100. In addition, the logic circuit area LC may include the timing controller 10, the row driver 20, the ramp generator 30, the counter controller 40, the column driver 50, the analog digital converter 200, and the like.

The image sensor 2 may sense an object captured through a lens under the control of an image processor. The image processor may output an image, which has been sensed and outputted by the image sensor 2, to a display. The display may include any device capable of outputting an image, such as a computer, a smartphone, or any other type of image display terminal. For example, the display may be configured in the form of a liquid crystal display (LCD), an organic light-emitting diode (OLED), or the like.

The pixel array 100 may include a plurality of pixels arranged in a matrix, which are respectively connected to a plurality of row lines and a plurality of column lines. Each of the pixels may include a red pixel for converting light in a red spectral region into an electrical signal, a green pixel for converting light in a green spectral region into an electrical signal, and a blue pixel for converting light in a blue spectral region into an electrical signal. In addition, a color filter array may be arranged above each of the pixels, which constitute the pixel array 100, to transmit light in a particular spectral region.

The pixel array 100 may include a plurality of photosensitive elements such as photodiodes or pinned photodiodes. The pixel array 100 senses light using a plurality of photosensitive elements, and converts the light into an electrical signal to generate an image signal. This will be described later with reference to FIG. 4.

The timing controller 10 may control operation or timing of each of the row driver 20, the ramp generator 30, the counter controller 40, and the analog digital converter 200 by outputting a control signal or a clock signal to each of the row driver 20, the ramp generator 30, the counter controller 40, and the analog digital converter 200.

The counter controller 40 may receive a control signal and transmit a counter control signal to counters included in the analog digital converter 200 to control operations of the counters. The counter control signal may include a code generation clock signal CODE_EN, which controls generation of count code by the counter, and the like.

The row driver 20 may drive the pixel array 100. The row driver 20 may allow a reset component and an image signal component to be outputted from the pixels of the pixel array 100. Here, the row driver 20 may not select a specific row of the pixel array 100. For example, the row driver 20 may enable signals to be outputted from all the pixels of the pixel array 100 during a specific time period. That is, all the pixels of the pixel array 100 may simultaneously output signals. In this case, the image sensor 2 may be referred to as a digital pixel sensor (DPS). However, the one or more embodiments are not limited thereto, and the row driver 20 may select a specific row of the pixel array 100.

The analog digital converter 200 may compare a reference signal provided from the ramp generator 30 with a pixel signal provided from the pixel array 100 to output a comparison result signal. The analog digital converter 200 may count the comparison result signals and output a digital signal to the column driver 50.

The column driver 50 may temporarily store the received digital signal and perform an operation on the received digital signal. The column driver 50 may provide the operation result of the digital signal to the image signal processor 3.

The analog digital converter 200 may process both an analog signal and a digital signal. Specifically, a part of the analog digital converter 200 may convert the pixel signal into a digital signal, and another part of the analog digital converter 200 may compare the converted digital signal with the reference signal to output the comparison result signal. However, the one or more embodiments are not limited thereto, and the correlated double sampling may be performed by a separate device or component.

Figure 4:
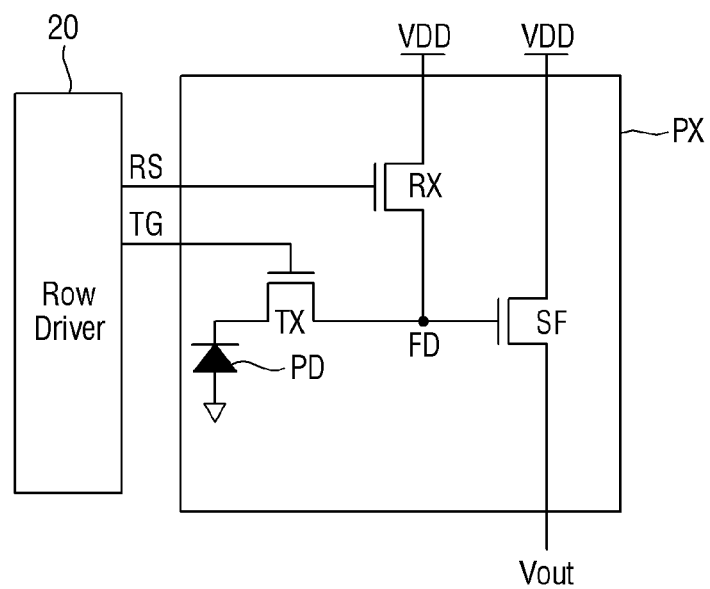
FIG. 4 is a diagram illustrating a pixel according to an embodiment.

FIG. 4 is a diagram illustrating a pixel according to an embodiment.

Referring to FIG. 4, a pixel PX may include a photodiode PD, a transfer transistor TX, a reset transistor RX, a source follower SF, and the like.

One end of the transfer transistor TX may be connected to the photodiode PD, the other end thereof may be connected to a floating diffusion region FD, and the control electrode thereof may receive a control signal TG.

One end of the reset transistor RX may receive a source voltage VDD, the other end thereof may be connected to the floating diffusion region FD, and the control electrode thereof may receive a control signal RS. One end of the source follower SF may receive the source voltage VDD, and the control electrode thereof may be connected to the floating diffusion region FD.

The control signals TG and RS, which may respectively control the transistors TX and RX, may be outputted from the row driver 20. An output signal Vout of the source follower SF may be supplied to the column line. The output signal Vout may be an analog signal.

In FIG. 4, the pixel PX includes one photodiode PD. However, the one or more embodiments are not limited thereto, and the pixel PX may include N (where, N is a natural number) photodiodes PDs. For example, in the pixel PX, four photodiodes PD may share the transfer transistor TX, the reset transistor RX, and the source follower SF. That is, the pixel PX may have a 4-shared structure.

Figure 5:
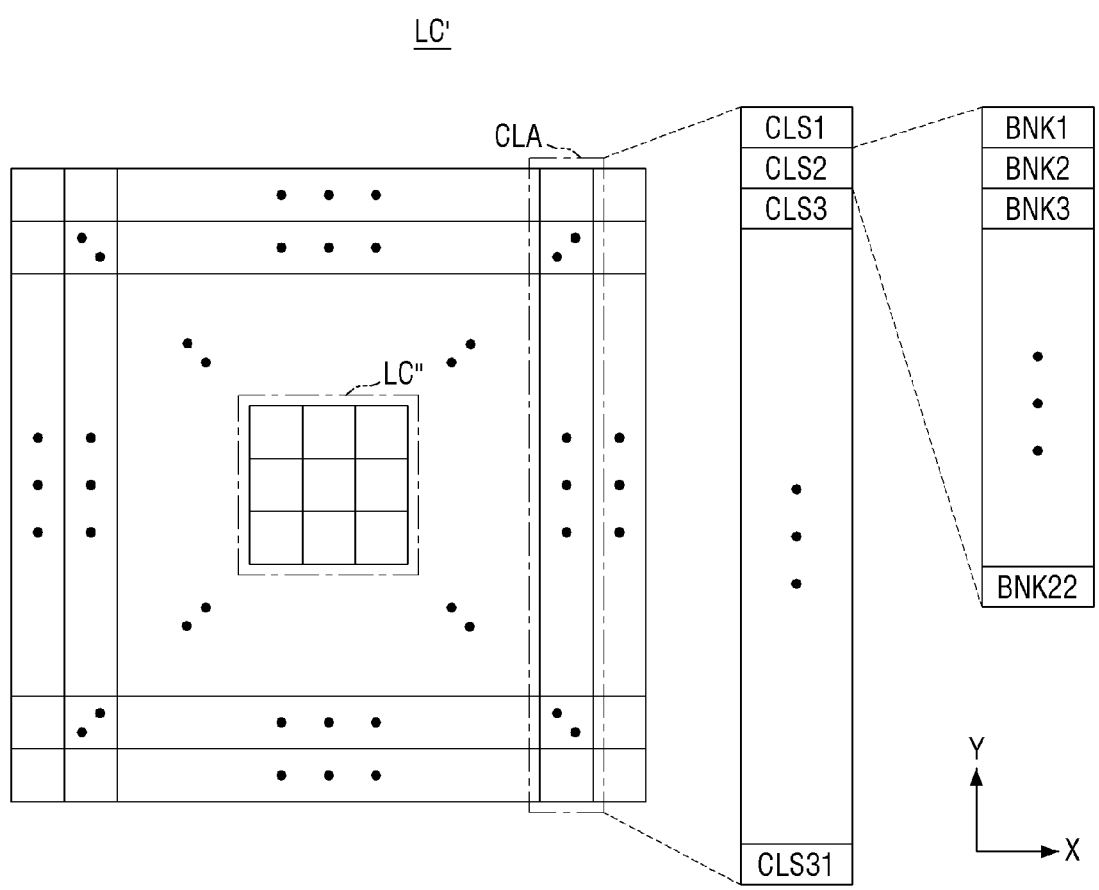
FIGS. 5 to 7 are diagrams illustrating a logic circuit area and a pixel array area according to one or more embodiments.
Figure 6:
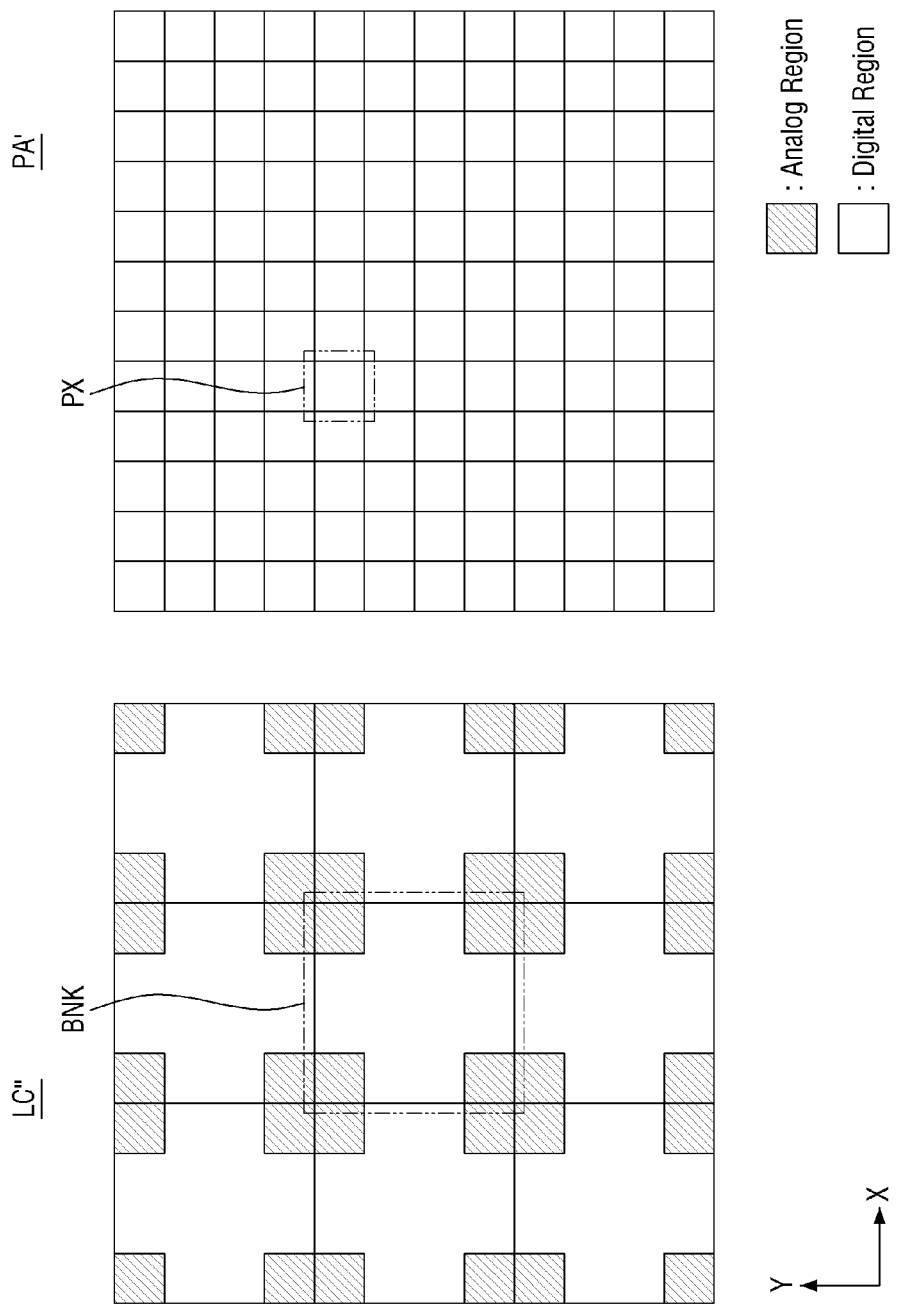
Figure 7:
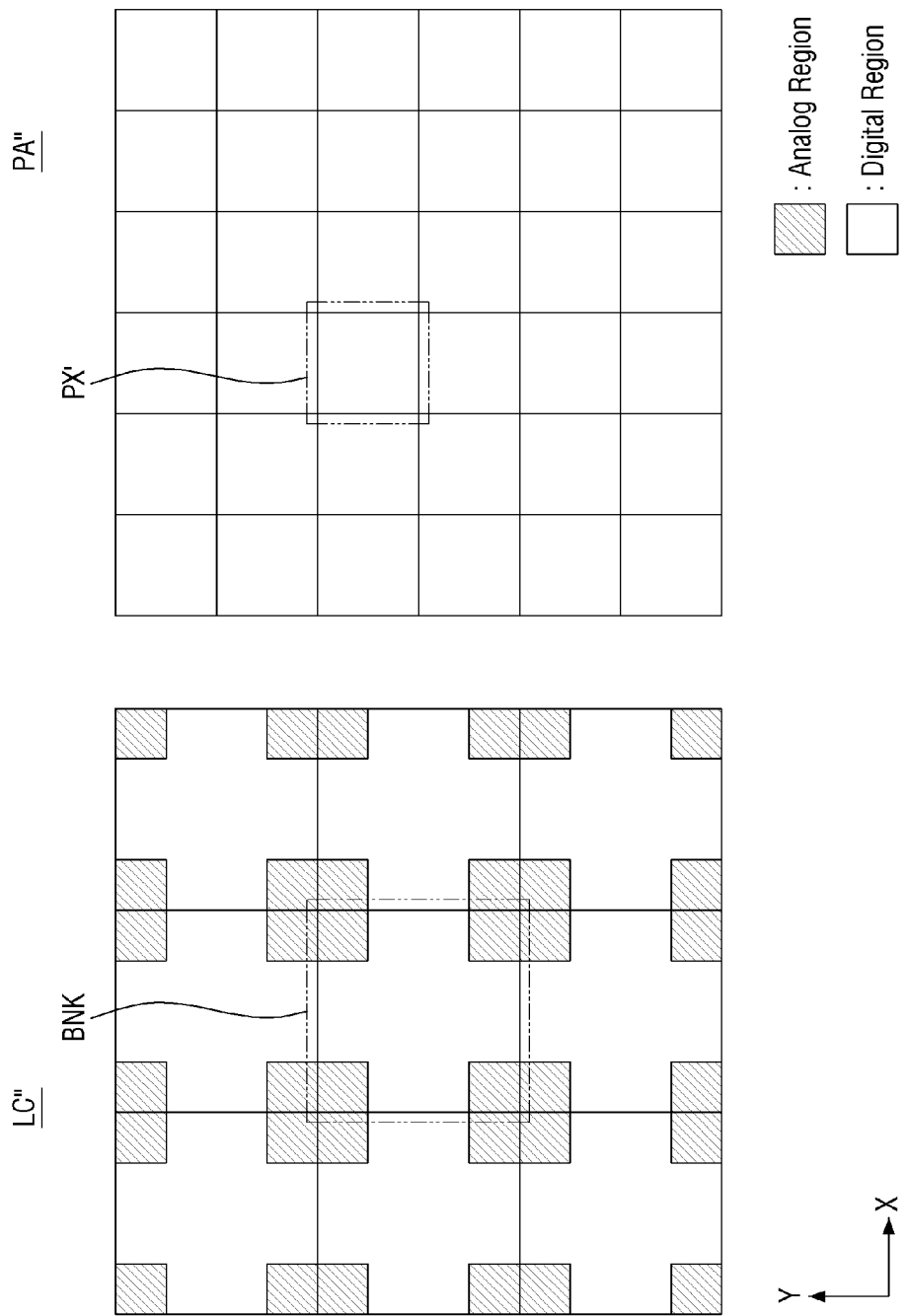

FIGS. 5 to 7 are diagrams illustrating a logic circuit area and a pixel array area according to one or more embodiments.

Referring to FIG. 5, a logic circuit area LC' may be a part of the logic circuit area LC described with reference to FIGS. 2 and 3. For example, the logic circuit area LC' may be disposed in the second region R2 under the pixel array area PA. That is, the logic circuit area LC' may be disposed to correspond to the pixel array area PA.

The logic circuit area LC' may be the analog digital converter 200 of FIG. 3. That is, the analog digital converter 200 may be implemented as the logic circuit area LC'. The logic circuit area LC' may convert an analog pixel signal received from the pixel array 100 into a digital signal. However, the one or more embodiments of the disclosure are not limited thereto.

The logic circuit area LC' may be arranged in a matrix form extending in a first direction X and a second direction Y. For example, the logic circuit area LC' may include a plurality of column arrays CLA. The plurality of column arrays CLA may be arranged side by side along the first direction X. Further, one column array CLA may be arranged to correspond to one column of the pixel array 100.

The column array CLA may include, for example, a plurality of clusters CLS1 to CLS31. The plurality of clusters CLS1 to CLS31 may be arranged along the second direction Y. The column array CLA may include 31 clusters in total. However, the one or more embodiments are not limited thereto, and the column array CLA may include more or less clusters than 31 clusters.

Referring to FIG. 5, a second cluster CLS2 of the clusters CLS1 to CLS31 may include a plurality of banks BNK1 to BNK22. The plurality of banks BNK1 to BNK22 may be arranged along the second direction Y. The second cluster CLS2 may include, for example, 22 banks. However, the one or more embodiments are not limited thereto, and the cluster CLS2 may include more or less banks than 22 banks.

For example, the bank BNK1 may be the smallest unit constituting the logic circuit area LC'. One bank BNK1 may correspond to one pixel PX of the pixel array area PA. That is, the bank BNK1 may be directly connected to the one pixel PX and receive the pixel signal from the one pixel PX. Further, the bank BNK1 may convert the pixel signal, which is an analog signal, into a digital signal, and compare the digital signal with a reference signal and output a comparison result signal. According to an embodiment, one bank BNK1 may correspond to a plurality of pixels PX of the pixel array area PA. That is, the bank BNK1 may be connected to the plurality of pixels PX of the pixel array area PA and receive a plurality of pixel signals from the plurality of pixel PX.

Referring to FIGS. 5 to 7, a logic circuit area LC" may be a part of the logic circuit area LC'. For example, the logic circuit area LC" may extend in the first direction X and the second direction Y, and may include a plurality of banks BNK. Further, a pixel array area PA' may be a part of the pixel array area PA. The pixel array area PA' may include a plurality of pixels PX.

Referring to FIG. 6, the logic circuit area LC" and the pixel array area PA' may be disposed to correspond to each other. For example, the pixel array area PA' located in the first region R1 may be disposed above the logic circuit area LC" located in the second region R2. Further, the bank BNK of the logic circuit area LC" may correspond to a part of the pixel array area PA'. For example, the bank BNK located at the center of the logic circuit area LC" may be disposed to correspond to the plurality of pixels, for example, 16 pixels PX of the pixel array area PA'. The pixel PX may overlap the bank BNK. That is, the plurality of pixels PX may overlap the bank BNK.

The bank BNK may include an analog region and a digital region. The analog region may refer to a part of the bank BNK, which processes an analog signal, and the digital region may refer to another part of the bank BNK, which processes a digital signal. The analog region may be directly connected to the pixel array PA'. For example, the analog region of the bank BNK may be directly connected to the pixel PX. Also, the analog region of the bank BNK may be directly connected to the plurality of pixels PX, but the one or more embodiments are not limited thereto.

The pixel signal outputted from the pixel PX may be transmitted to the analog region of the bank BNK. The analog region of the bank BNK may convert the pixel signal, which is an analog signal, into a digital signal. Thereafter, the digital region of the bank BNK may perform digital signal processing on the pixel signal that has been converted into the digital signal.

The analog region of the bank BNK may be defined as an edge part or a corner part of the bank BNK. For example, the bank BNK may be a part of the logic circuit area LC" disposed in a mesh shape. Although the bank BNK is illustrated as a square in the drawing, the one or more embodiments are not limited thereto, and the banks BNK may be in any other shapes. The plurality of analog regions of the bank BNK may be spaced apart from each other at the corner portions of the bank BNK. For example, the analog regions may be spaced apart from each other in the bank BNK, in the first direction X and the second direction Y. In addition, the digital region of the bank BNK may be defined as a part except the plurality of analog regions. For example, referring to FIG. 5, each of the plurality of banks BNK may include an analog region and a digital region. Specifically, an analog region may be disposed such that four analog regions are formed at each corner of a center bank BNK, and a digital region may be a region that is not occupied by the four analog regions of the center bank BNK. The other banks BNK of the plurality of banks BNK may be formed in a manner similar to the center bank BNK described above.

The pixel PX may overlap the analog region. That is, at least one pixel PX of the pixel array area PA' may overlap one analog region of the logic circuit area LC". For example, four pixels PX of the pixel array area PA' may overlap all four analog regions of the logic circuit area LC". However, the one or more embodiments are not limited thereto, and the pixel PX may overlap the digital region of the logic circuit area LC".

Referring to FIG. 7, the pixel array area PA" may include a plurality of pixels PX'. The plurality of pixels PX' may be arranged to correspond to one bank BNK. For example, four pixels PX' may be arranged to correspond to one bank BNK. In this case, each analog region of the bank BNK may be directly connected to each pixel PX'. Specifically, for example, four pixels PX' at the center of the pixel array area PA" may overlap with the bank BNK at the center of the logic circuit area LC" such that a portion of each pixel PX' of the four pixel PX' overlaps respective analog regions disposed at four corners of the bank BNK. However, the one or more embodiments are not limited thereto, and the plurality of pixels of the pixel array area and the analog regions in the plurality of banks of the logic circuit area may be configured differently.

Figure 8:
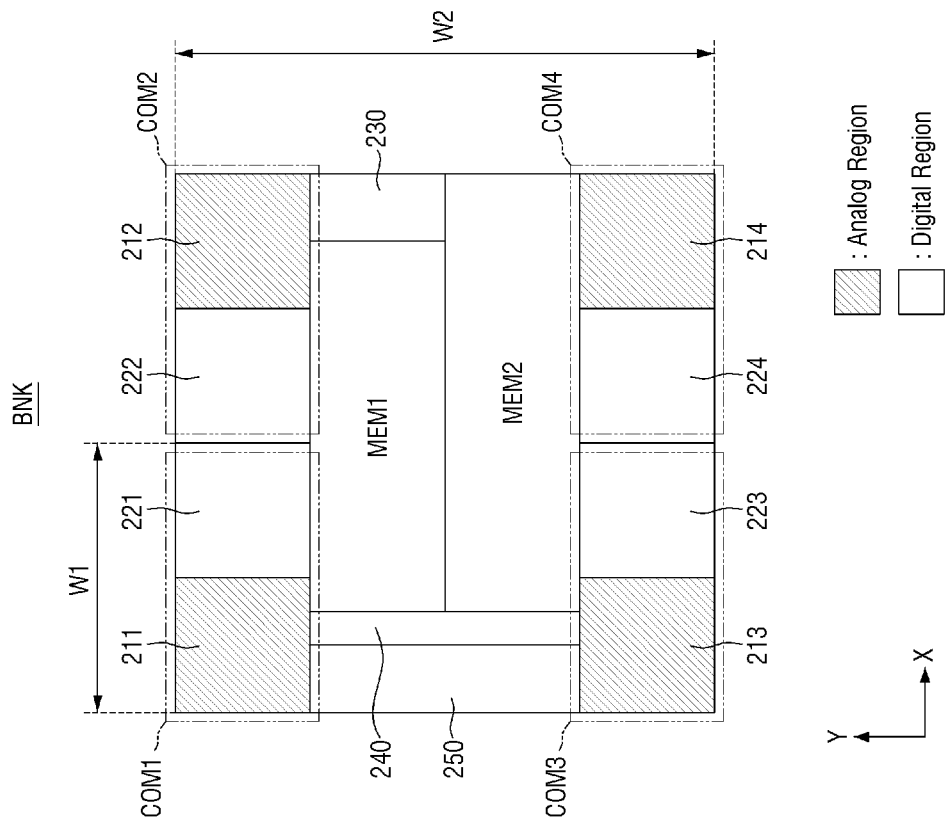
FIG. 8 is a diagram illustrating a layout of a bank according to an embodiment.

FIG. 8 is a layout of a bank according to an embodiment.

Referring to FIG. 8, the bank BNK may include comparators COM1 to COM4, a first memory MEM1, a second memory MEM2, a word line buffer 230, a word line controller 240, a buffer 250, and the like. The components described above may be arranged on a plane.

The comparators COM1 and COM2 may be arranged in a line along the first direction X. The comparators COM1 and COM2 may be disposed adjacent to each other and connected to each other. The comparator COM1 may include a first comparator 211 and a second comparator 221, and the comparator COM2 may include a first comparator 212 and a second comparator 222. Here, the first comparator 211 of the COM1 and the first comparator 212 of the COM2 (collectively referred to as "first comparators 211 and 212") may correspond to the analog regions, and the second comparator 221 of the COM1 and the second comparator 222 of the COM2 (collectively referred to as "second comparators 211 and 222") may correspond to the digital regions. That is, the first comparators 211 and 212 may perform analog signal processing on a pixel signal, and the second comparators 221 and 222 may perform digital signal processing on a pixel signal.

The comparators COM3 and COM4 may be arranged in a line along the first direction X. The comparators COM3 and COM4 may be disposed to be spaced apart from the comparators COM1 and COM2 in the second direction Y. The comparators COM3 and COM4 may be disposed adjacent to each other and connected to each other. The comparator COM3 may include a first comparator 213 and a second comparator 223, and the comparator COM4 may include a first comparator 214 and a second comparator 224. Here, the first comparator 213 of the COM3 and the first comparator 214 of the COM4 (collectively referred to as "first comparators 213 and 214") may correspond to the analog regions, and the second comparator 223 of the COM3 and the second comparator 224 of the COM4 (collectively referred to as "second comparators 223 and 224") may correspond to the digital regions. That is, the first comparators 213 and 214 may perform analog signal processing on a pixel signal, and the second comparators 223 and 224 may perform digital signal processing on a pixel signal.

The width of the comparator COM1 measured in the first direction X may be a first width W1. For example, the first width W1 may be about 4.95 μm. However, the one or more embodiments are not limited thereto, and the first width W1 may be less or greater than 4.95 μm. Further, the widths of the comparators COM2, COM3, and COM4 measured in the first direction X may also be the same as the first width W1. Furthermore, the width of the bank BNK measured in the second direction Y may be a second width W2. The second width W2 may be about 10 μm. However, the one or more embodiments are not limited thereto, the second width W2 may be greater or less than 10 μm.

The first memory MEM1 and the second memory MEM2 (collectively referred to as "first and second memories MEM1 and MEM2") may be disposed between the comparators COM1 and COM2 and the comparators COM3 and COM4.

The first memory MEM1 may be disposed adjacent to the comparators COM1 and COM2. That is, the first memory MEM1 may be disposed adjacent to the first and second comparators 211 and 221, and the first and second comparators 212 and 222. For example, the first memory MEM1 may be disposed adjacent to the comparators COM1 and COM2 in the second direction Y. The comparators COM1 and COM2 may connected to the first memory MEM1.

The second memory MEM2 may be disposed adjacent to the comparators COM3 and COM4. That is, the second memory MEM2 may be disposed adjacent to the first and second comparators 213 and 223, and the first and second comparators 214 and 224. For example, the second memory MEM2 may be disposed adjacent to the comparators COM3 and COM4 in the second direction Y. The comparators COM3 and COM4 may be connected to the second memory MEM2.

An area occupied by the second memory MEM2 in the bank BNK may be larger than an area occupied by the first memory MEM1 in the bank BNK. For example, the number of memory cells included in the second memory MEM2 may be greater than the number of memory cells included in the first memory MEM1.

The word line buffer 230 may be disposed adjacent to the first memory MEM1. Specifically, the word line buffer 230 may be disposed adjacent to the first memory MEM1, the second memory MEM2, and the first comparator 212 of the COM2. Due to the word line buffer 230, the first memory MEM1 may occupy the area less than that of the second memory MEM2.

Here, the first and second memories MEM1 and MEM2 may include a volatile memory or the like. For example, the first and second memories MEM1 and MEM2 may include a DRAM, an SRAM, or the like. However, the one or more embodiments are not limited thereto, and the first and second memories MEM1 and MEM2 may include a nonvolatile memory such as a flash memory.

The word line controller 240 may be disposed adjacent to the first and second memories MEM1 and MEM2 in a direction opposite to the first direction X. The word line controller 240 may be disposed adjacent to the first comparators 211 and 213, and the first and second memories MEM1 and MEM2. The word line controller 240 may buffer the control signal and the like provided from the timing controller 10.

The buffer 250 may be disposed between the comparators COM1 and COM3. The buffer 250 may be disposed adjacent to the first comparator 211 of the COM1, the first comparator 213 of the COM3, and the word line controller 240. The buffer 250 may provide count code to each of the first and second memories MEM1 and MEM2, and transmit the count code read out from each of the first and second memories MEM1 and MEM2 to any external components or to the outside.

Hereinafter, an operation of the bank BNK included in the logic circuit area LC' will be described with reference to FIGS. 9 to 12.

Figure 9:
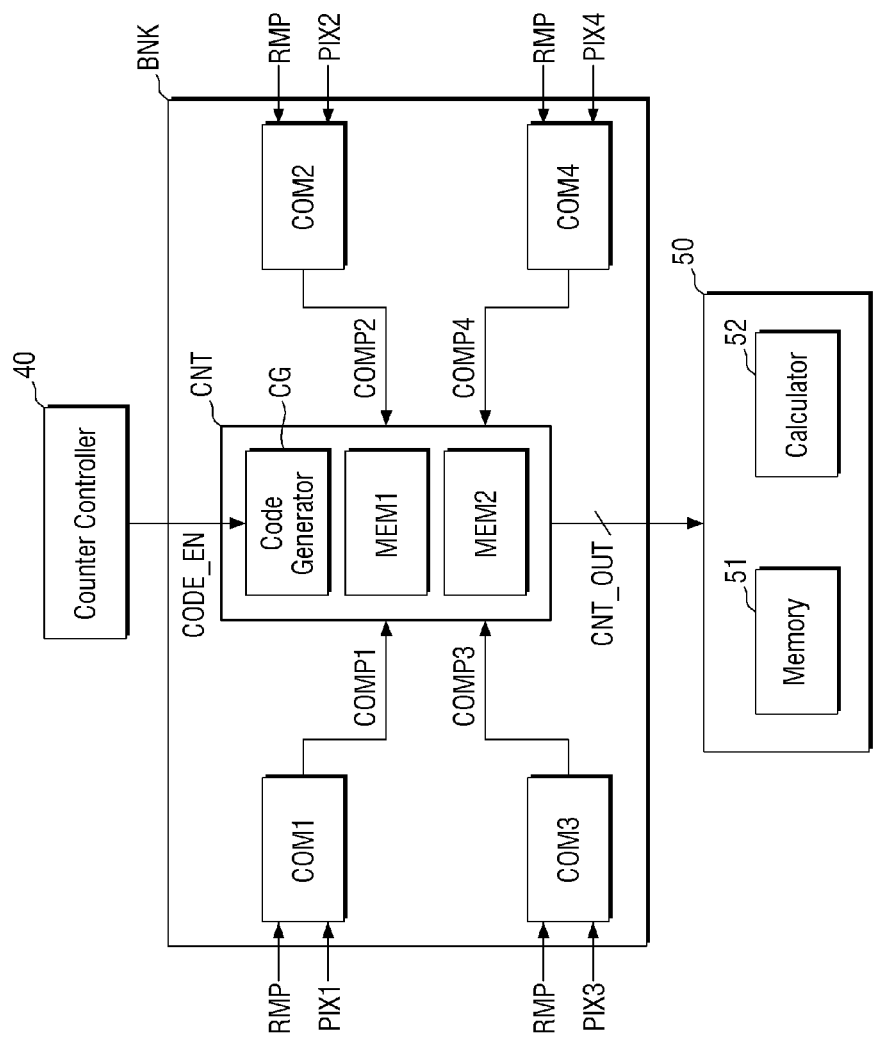
FIG. 9 is a block diagram illustrating a bank according to an embodiment.
Figure 10:
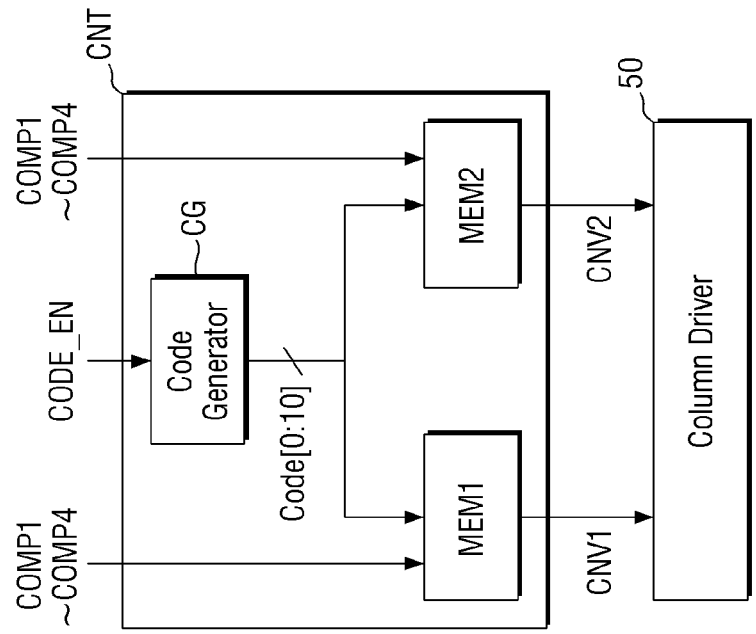
FIG. 10 is a block diagram illustrating a counter of FIG. 9, according to an embodiment.
Figure 11:
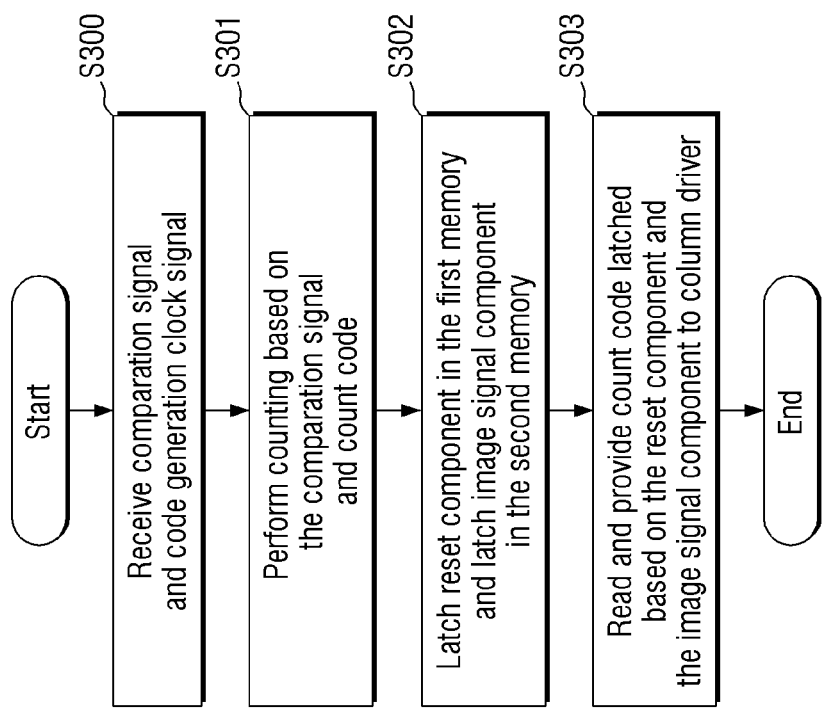
FIG. 11 is a block diagram explaining an operation of the counter of FIG. 9, according to an embodiment.

FIG. 9 is a block diagram illustrating a bank according to an embodiment. FIG. 10 is a block diagram illustrating a counter of FIG. 9, according to an embodiment. FIG. 11 is a block diagram explaining an operation of the counter of FIG. 9, according to an embodiment.

Referring to FIG. 9, the bank BNK may include the plurality of comparators COM1 to COM4 and a counter CNT. As shown in the layout of FIG. 8, the plurality of comparators COM1 to COM4 may be disposed at the sides of the bank BNK. The comparators COM1 to COM 4 may respectively receive a first pixel signal PIX1, a second pixel signal PIX2, a third pixel signal PIX3, and a fourth pixel signal PIX4, from the pixel PX.

The comparator COM1 may compare the first pixel signal PIX1 with a reference signal RMP to output a first comparison result signal COMP1. The comparator COM2 may compare the second pixel signal PIX2 with the reference signal RMP to output a second comparison result signal COMP2. The comparator COM3 may compare the third pixel signal PIX3 with the reference signal RMP to output a third comparison result signal COMP3. The comparator COM4 may compare the fourth pixel signal PIX4 with the reference signal RMP to output a fourth comparison result signal COMP4. The outputted first to fourth comparison result signals COMP1 to COMP4 may be provided to the counter CNT.

In some embodiments, the counter CNT may include a count code generator CG, and the first and second memories MEM1 and MEM2. Referring to FIG. 8, the first and second memories MEM1 and MEM2 may be located in the center of the bank BNK, and the count code generator CG may be included in the word line buffer 230.

Referring to FIGS. 9 to 11, the counter CNT may receive the first to fourth comparison result signals COMP1 to COMP4 and code generation clock signal CODE_EN (step S300). The code generator CG may receive the code generation clock signal CODE_EN from the counter controller 40. The code generator CG may generate count code Code[0:10] based on the code generation clock signal CODE_EN. The count code Code[0:10] may include a plurality of count codes. For example, the count code Code[0:10] may include a plurality of count codes Code<0>, Code<1>, Code<2>, Code<3>, Code<4>, Code<5>, Code<6>, Code<7>, Code<8>, Code<9>, and Code<10>. For example, the count code Code[0:10] may be 11 bits. However, the one or more embodiments of the disclosure are not limited thereto, and the count code may include more or less bits.

The generated count code Code[0:10] and the first to fourth comparison result signals COMP1 to COMP4 may be transmitted to the first memory MEM1. Further, the generated count code Code[0:10] and the first to fourth comparison result signals COMP1 to COMP4 may be transmitted to the second memory MEM2.

The first to fourth comparison result signals COMP1 to COMP4 transmitted to the first memory MEM1 may be different from the first to fourth comparison result signals COMP1 to COMP4 transmitted to the second memory MEM2. For example, the first to fourth comparison result signals COMP1 to COMP4 transmitted to the first memory MEM1 may be generated based on reset components of the pixel signals PIX1 to PIX4. The first to fourth comparison result signals COMP1 to COMP4 transmitted to the second memory MEM2 may be generated based on image signal components of the pixel signals PIX1 to PIX4. In addition, the first to fourth comparison result signals COMP1 to COMP4 may be transmitted to the first memory MEM1 at a different time from when the first to fourth comparison result signals COMP1 to COMP4 are transmitted to the second memory MEM2.

The counter CNT may count based on the first to fourth comparison result signals COMP1 to COMP4 and the count code Code[0:10] (step S301). The counter CNT may latch the count code Code[0:10] in the first memory MEM1 based on the reset components of the first to fourth comparison result signals COMP1 to COMP4, and may latch the count code Code[0:10] in the second memory MEM2 based on the image signal components of the first to fourth comparison result signals COMP1 to COMP4 (step S302).

For example, the counter CNT may latch the count code Code[0:10] based on the reset components of the first to fourth comparison result signals COMP1 to COMP4. The counter CNT may latch the count code Code[0:10] in the first memory MEM1 based on the reset components of the first to fourth comparison result signals COMP1 to COMP4.

Further, for example, the counter CNT may latch the count code Code[0:10] based on the image signal components of the first to fourth comparison result signals COMP1 to COMP4. The counter CNT may latch the count code Code[0:10] in the second memory MEM2 based on the image signal components of the first to fourth comparison result signals COMP1 to COMP4.

The storage capacity of the first memory MEM1 may be smaller than the storage capacity of the second memory MEM2. For example, the storage capacity of the first memory MEM1, in which the count code Code[0:10] is latched based on the reset components of the first to fourth comparison result signals COMP1 to COMP4, may be 40 bits. The storage capacity of the second memory MEM2, in which the count code Code[0:10] is latched based on the image signal components of the first to fourth comparison result signals COMP1 to COMP4, may be 44 bits.

Subsequently, the counter CNT may read count code values CNV1 and CNV2, which are latched based on the reset component and the image signal component, to provide them to the column driver 50 (step S303). The counter CNT may provide a count output signal CNT_OUT latched during a sensing period to the column driver 50. Here, the count output signal CNT_OUT may be provided to the column driver 50 via the buffer 250. Further, after the first count code value CNV1 is outputted from the first memory MEM1, the second count code value CNV2 may be outputted from the second memory MEM2. However, the one or more embodiments are not limited thereto.

The first and second count code values CNV1 and CNV2 provided to the column driver 50 may be temporarily stored in a memory 51. For example, the memory 51 may be a line memory. However, the memory 51 may not include a frame memory.

A calculator 52 may calculate a result value based on the first and second count code values CNV1 and CNV2 that are read out from the memory 51. For example, the calculator 52 may extract the image signal component by subtracting the first count code value CNV1 from the second count code value CNV2.

Figure 12:
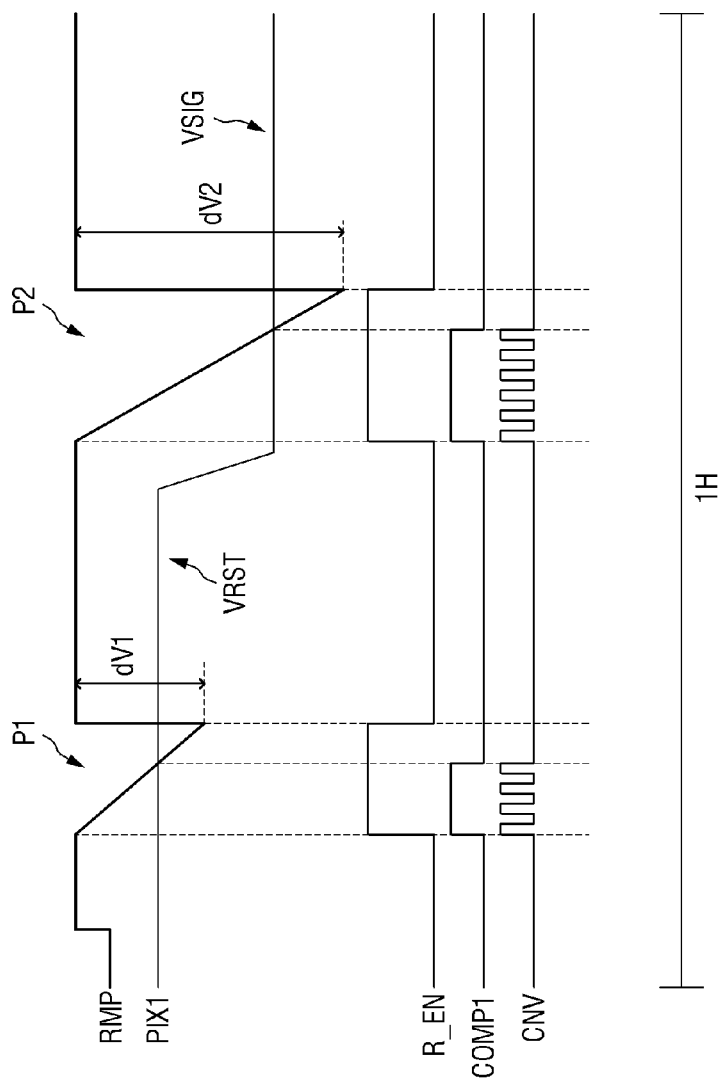
FIG. 12 is a timing diagram illustrating an operation of a digital pixel sensor according to an embodiment.

FIG. 12 is a timing diagram illustrating an operation of a digital pixel sensor according to according to an embodiment.

Referring to FIGS. 9 to 12, the ramp generator 30 may provide the reference signal RMP, which sequentially has a first pulse P1 having a height lowered by a first level dV1 from a reference voltage and a second pulse P2 having a height lowered by a second level dV2 from the reference voltage during one sensing period 1H, to the comparators COM1 to COM4. Hereinafter, the following description will be made based on providing the reference signal RMP to the comparator COM1.

Specifically, the ramp generator 30 may sequentially generate the first pulse P1 having a first height and the second pulse P2 having a second height greater than the first height as the reference signal RMP in response to a ramp enable signal R_EN during one sensing period 1H. The ramp generator 30 may provide the reference signal RMP to the comparator COM1.

The comparator COM1 may compare the first pixel signal PIX1 with the reference signal RMP at a predetermined time point (e.g., when the comparator COM1 is enabled), and output the comparison result to the counter CNT as the first comparison result signal COMP1.

The counter CNT may convert the first pixel signal PIX1 into a digital signal by counting the first comparison result signals COMP1. For example, the first count code value CNV1 may be latched in the first memory MEM1 of the counter CNT. Subsequently, the counter CNT may convert the second pixel signal PIX2 into a digital signal by counting the second comparison result signals COMP2. For example, the second count code value CNV2 may be latched in the second memory MEM2 of the counter CNT.

After the first and second count code values CNV1 and CNV2 are latched, the first and second count code values CNV1 and CNV2 may be read out from the first and second memories MEM1 and MEM2, respectively. That is, while latching of the first and second count code values CNV1 and CNV2 in the first and second memories MEM1 and MEM2 is being carried out, the first and second memories MEM1 and MEM2 may not be read.

Further, the first count code value CNV1 may not be read out between when the first count code value CNV1 is latched and when the second count code value CNV2 is latched. That is, a read out may not be performed during the latch period. Accordingly, noise generated in the analog digital converter 200 that includes the bank BNK can be further decreased. In addition, noise generated in the image sensor 2 can be further decreased.

Figure 13:
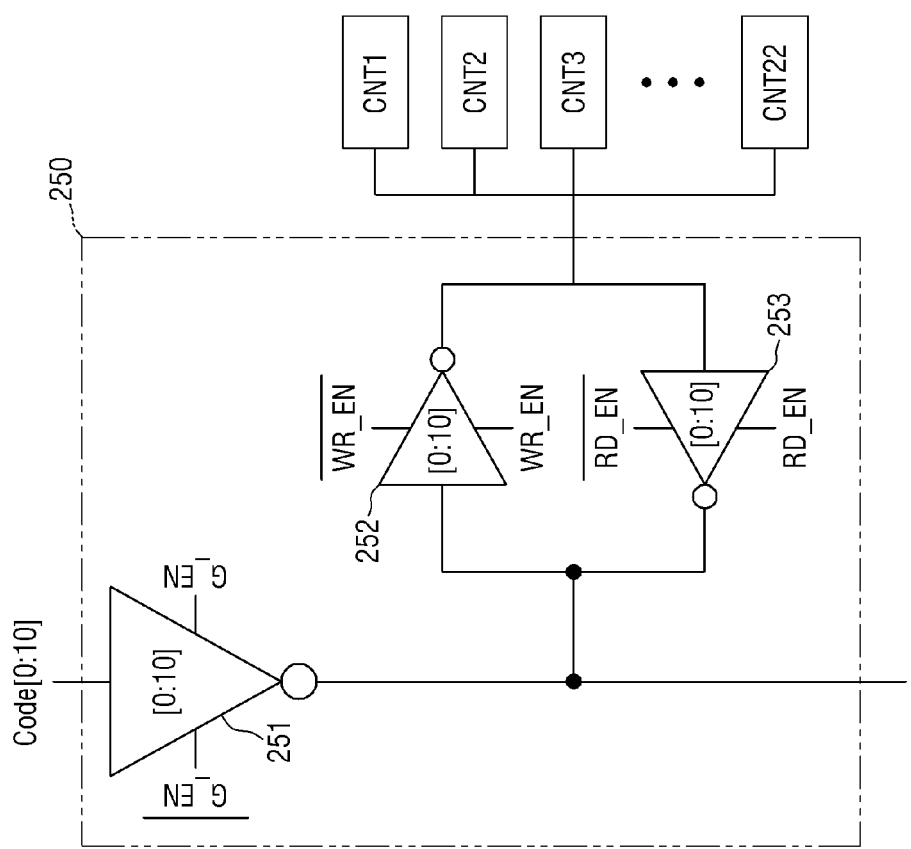
FIGS. 13 and 14 are diagrams explaining an operation of a bank according to one or more embodiments.
Figure 14:
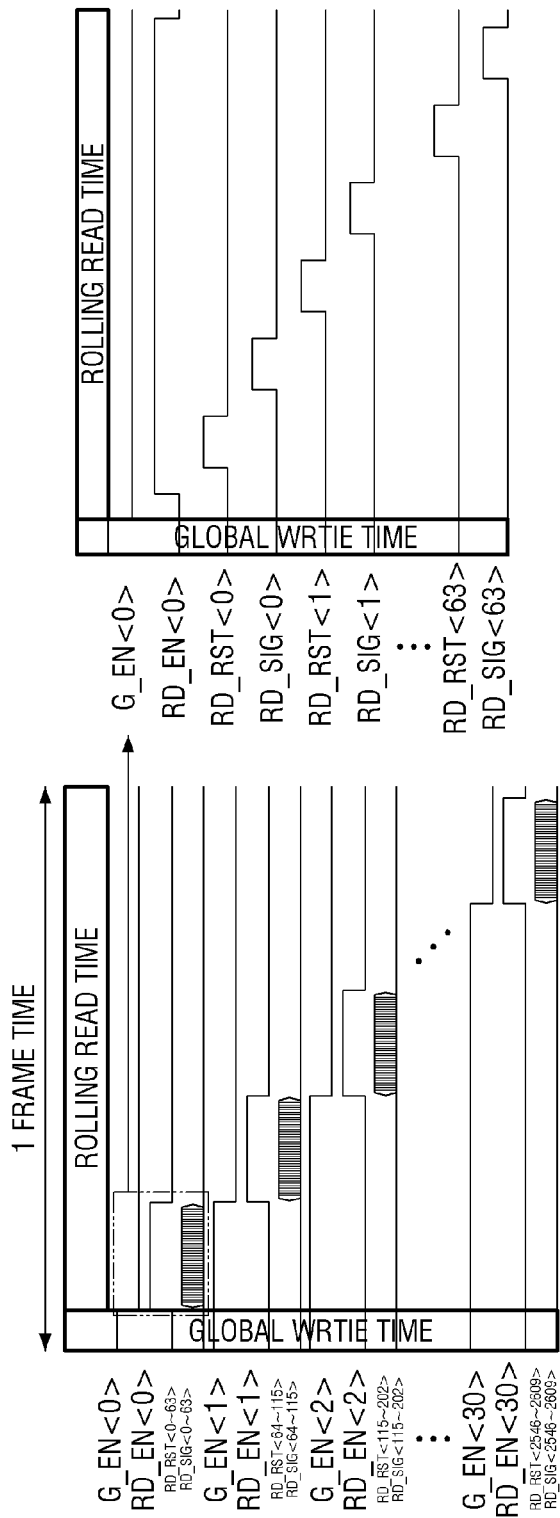
Figure 15:
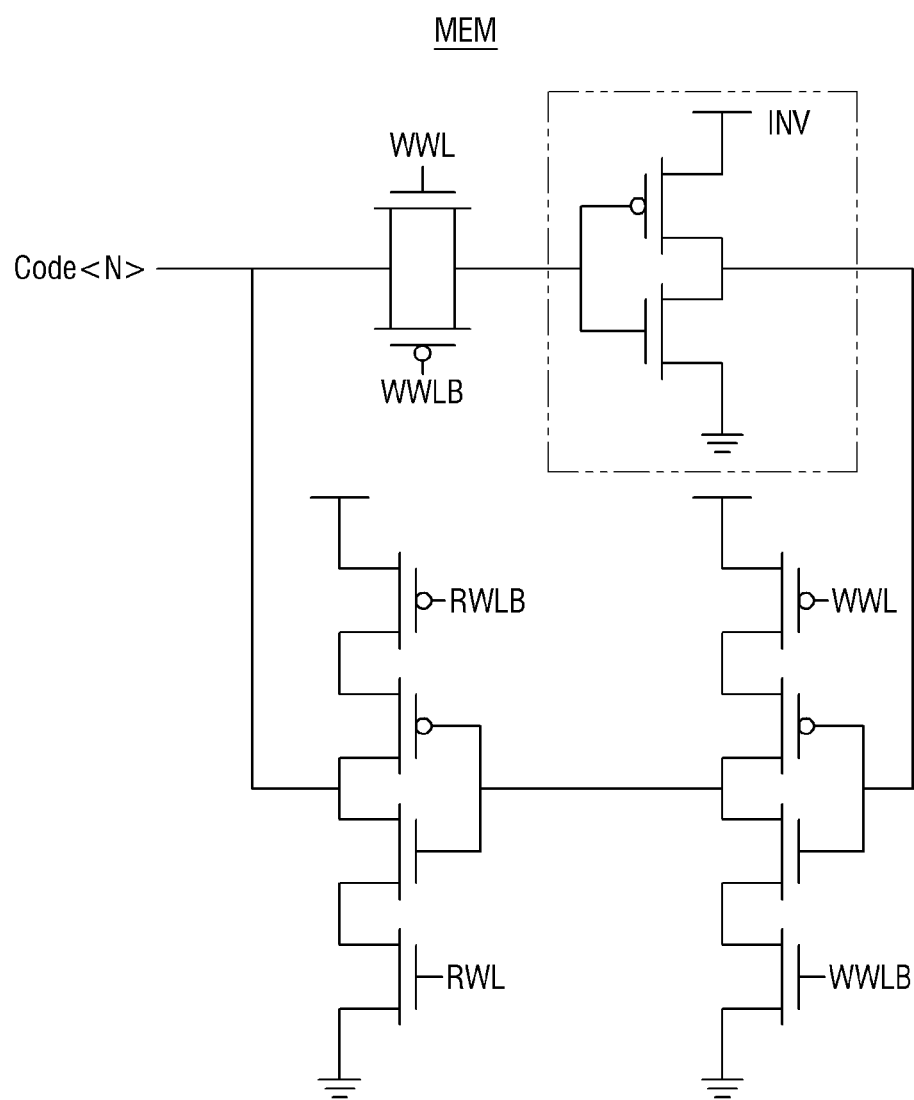
FIG. 15 is a circuit diagram of a memory according to an embodiment.

FIGS. 13 and 14 are diagrams explaining an operation of a bank according to an embodiment. FIG. 15 is a circuit diagram of a memory according to an embodiment.

Referring to FIGS. 13 and 14, the buffer 250 may be connected to a plurality of counters CNT1 to CNT22. The buffer 250 may include a global buffer 251, a first local buffer 252, and a second local buffer 253. As shown in FIG. 8, the buffer 250 may be disposed adjacent to the comparators COM1 and COM3, and the word line controller 240.

The global buffer 251 may be connected to the counter CNT of each bank BNK, and the first local buffer 252 and the second local buffer 253 (collectively referred to as "first and second local buffers 252 and 253") may be connected between a column line and each counter CNT. The buffer 250 may supply the count code Code[0:10] to the counter CNT or may transmit a signal read out from the counter CNT to the outside.

The count code Code[0:10] may be transmitted from the global buffer 251 to the first local buffer 252. The count code Code[0:10] transmitted to the first local buffer 252 may be transmitted to one of the first to twenty-second counters CNT1 to CNT22. For example, when global enable signals G_EN<0> to G_EN<30> are enabled, the count code Code[0:10] may be transmitted to all the clusters CLS and the banks BNK, and the count code Code[0:10] may be latched in each counter CNT. That is, during a global write time (GLOBAL WRITE TIME), the count code Code[0:10] may be latched in the counter CNT.

The global buffer 251 and the second local buffer 253 may output the count code value read out from the counter CNT to the outside. For example, when the global enable signal G_EN<0> is disabled and a read enable signal RD_EN<0> is enabled, the count code values may be read out sequentially from the respective counters CNT. The count code values may be outputted until the read enable signal RD_EN<0> is disabled. That is, the count code value corresponding to each bit may be outputted to the outside through the column line.

Referring to FIG. 13, the buffer 250 may include asynchronous buffers. For example, the global buffer 251 and the first and second local buffers 252 and 253 may be asynchronous buffers. An area of an asynchronous buffer may be smaller than an area of a synchronous buffer such as a flip-flop. Accordingly, by using the asynchronous buffers, an area occupied by the buffer 250 in the layout of the bank BNK shown in FIG. 8 can be further reduced.

Referring to FIG. 15, a memory MEM may receive and latch a count code Code<N>. The memory MEM may include the first memory MEM1 and the second memory MEM2 described above. That is, the memory MEM may be a memory cell that stores data in the first memory MEM1 or the second memory MEM2. For example, the memory MEM may be an SRAM. As illustrated in the drawing, the memory MEM may include a read transistor, a write transistor, an inverter INV, and a plurality of buffers that are connected to each other. The count code Code<N> may be latched in the memory MEM.

Hereinafter, an electronic device 2000 according to one or more embodiments will be described with reference to FIGS. 16 and 17.

Figure 16:
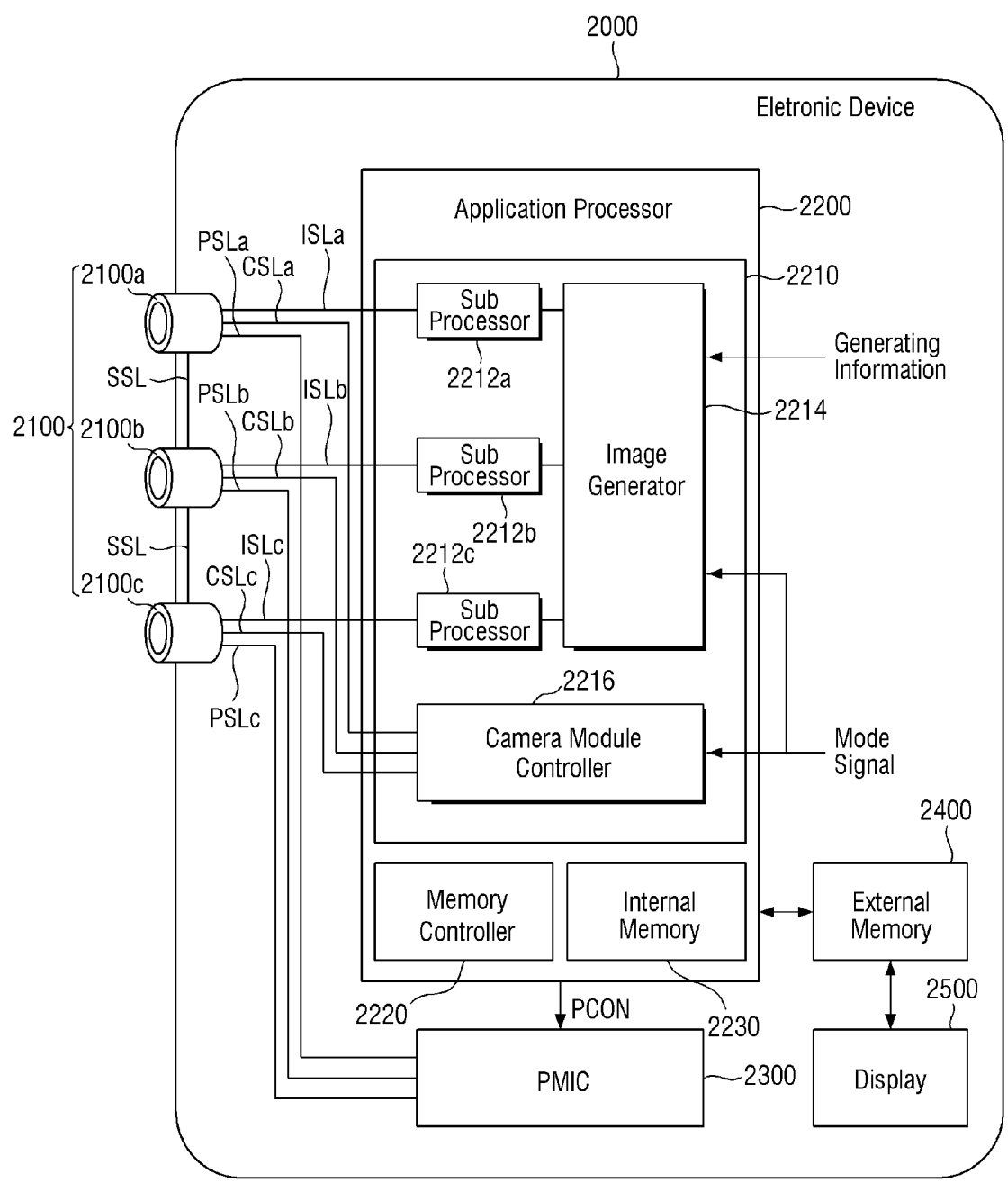
FIG. 16 is a block diagram illustrating an electronic device including a multi-camera module according to an embodiment.

FIG. 16 is a block diagram illustrating an electronic device including a multi-camera module according to an embodiment. FIG. 17 is a detailed block diagram of the camera module of FIG. 16, according to an embodiment. For simplicity of description, redundant parts of the description made with reference to FIGS. 1 to 15 will be recapitulated or omitted.

Referring to FIG. 16, the electronic device 2000 may include a camera module group 2100, an application processor 2200, a power management integrated circuit (PMIC) 2300, an external memory 2400, and a display 2500.

The camera module group 2100 may include a plurality of camera modules 2100a, 2100b, and 2100c. Although FIG. 16 only illustrates an embodiment in which three camera modules 2100a, 2100b, and 2100c are disposed, the one or more embodiments are not limited thereto. In some embodiments, the camera module group 2100 may be modified to include only two camera modules, or the camera module group 2100 may be modified to include n (where, n is a natural number equal to or greater than 1) camera modules.

Hereinafter, a detailed configuration of the camera module 2100b will be described with reference to FIG. 17. The following description may be equally applied to other camera modules 2100a and 2100c.

Figure 17:
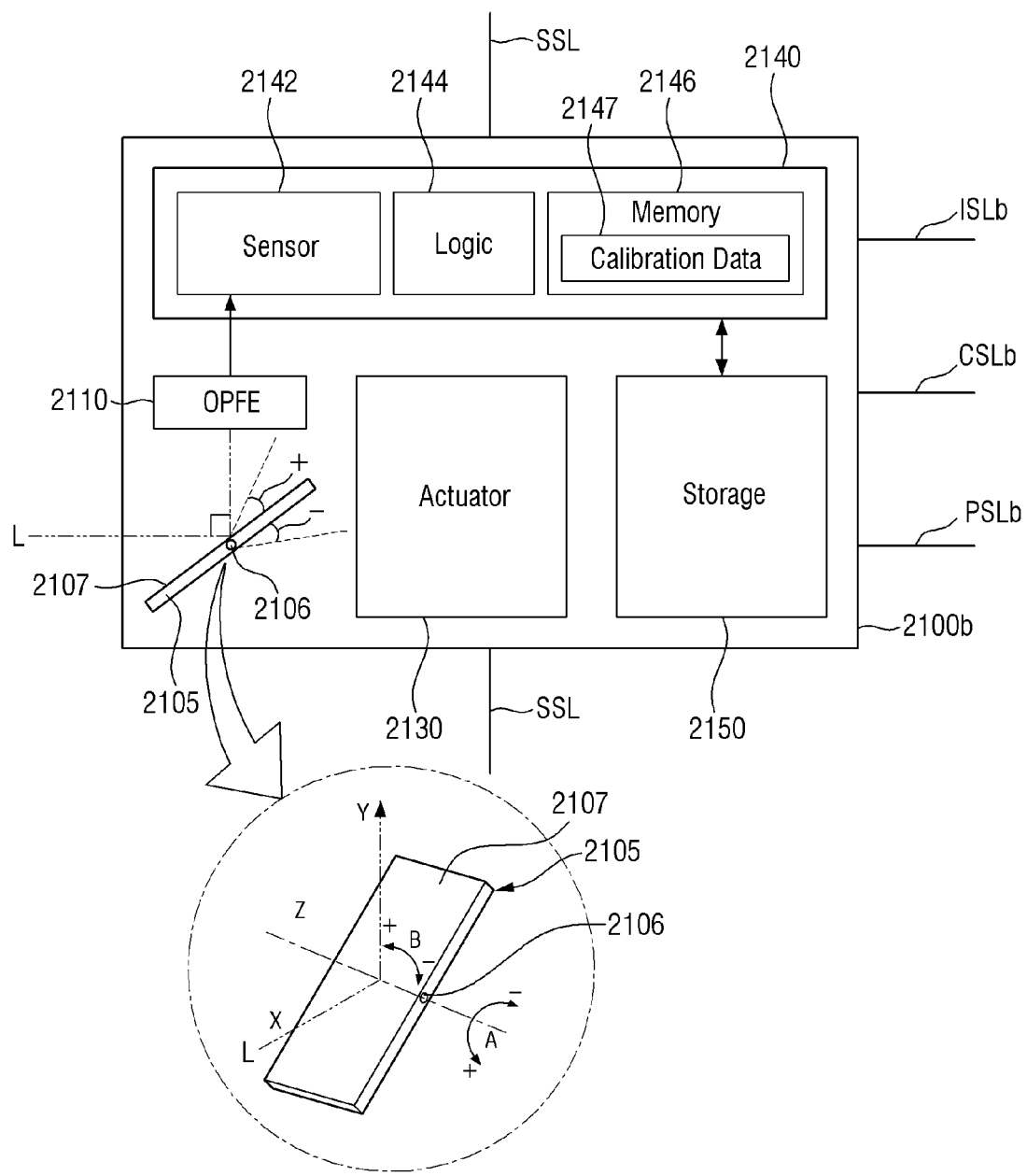
FIG. 17 is a detailed block diagram of the camera module of FIG. 16, according to an embodiment.

Referring to FIG. 17, the camera module 2100b may include a prism 2105, an optical path folding element (hereinafter, referred to as "OPFE") 2110, an actuator 2130, an image sensing unit 2140, and a storage unit 2150.

The prism 2105 may include a reflective surface 2107 having a light reflecting material capable of changing the path of light L incident upon the reflective surface 2107.

In some embodiments, the prism 2105 may change the path of the light L traveling in the first direction X to the second direction Y that is perpendicular to the first direction X. Further, the prism 2105 may rotate the reflective surface 2107 having the light reflecting material with respect to a central axis 2106 in an A direction, or rotate about the central axis 2106 in a B direction, thereby changing the path of the light L incident in the first direction X to the second direction Y perpendicular thereto. The OPFE 2110 may also move in a third direction Z perpendicular to the first direction X and the second direction Y.

In some embodiments, as shown in the drawing, the maximum rotation angle of the prism 2105 in the A direction may be about 15 degrees or less in the positive (+) A direction and greater than or equal to 15 degrees in the negative (−) A direction. However, the one or more embodiments are not limited thereto.

In some embodiments, the prism 2105 may move about 20 degrees, between 10 and 20 degrees, or between 15 and 20 degrees in the positive (+) or negative (−) B direction. In this case, the moving angle may be the same in the positive (+) or negative (−) B direction or may be almost the same in the positive (+) or negative (−) B directions with a difference of about 1 degree.

In some embodiments, the prism 2105 may move the reflective surface 2107 having the light reflecting material in the third direction (e.g., direction Z) parallel to the extending direction of the central axis 2106.

The OPFE 2110 may include, for example, m (where, m is a natural number) optical lenses. The m lenses may move in the second direction Y to change an optical zoom ratio of the camera module 2100b. For example, if it is assumed that a basic optical zoom ratio of the camera module 2100b is Z, the optical zoom ratio of the camera module 2100b may become 3Z, 5Z or more as the m optical lenses included in the OPFE 2110 are moved.

The actuator 2130 may move the optical lenses or the OPFE 2110 (hereinafter, referred to as "optical lens") to a specific position. For example, the actuator 2130 may adjust the position of the optical lens so that an image sensor 2142 may be positioned at a focal length of the optical lens for accurate sensing.

The image sensing unit 2140 may include the image sensor 2142, a control logic 2144, and a memory 2146. The image sensor 2142 may sense an image of a sensing target using the light L provided through the optical lens. In some embodiments, the image sensor 2142 may include the image sensor 2 described above.

The control logic 2144 may control the overall operation of the camera module 2100b. For example, the control logic 2144 may control the operation of the camera module 2100b according to a control signal provided through a control signal line CSLb.

The memory 2146 may store information such as calibration data 2147 for the operation of the camera module 2100b. The calibration data 2147 may include information to generate image data using the light L provided from the outside. The calibration data 2147 may include, for example, information on an optical axis, information on the degree of rotation, and information on the focal length described above. When the camera module 2100b is implemented in the form of a multi-state camera whose focal length varies according to the position of the optical lens, the calibration data 2147 may include information on auto focusing and a focal length value for each position (or state) of the optical lens.

The storage unit 2150 may store image data sensed through the image sensor 2142. The storage unit 2150 may be disposed outside the image sensing unit 2140, and may be implemented in a form of being stacked with a sensor chip constituting the image sensing unit 2140. In some embodiments, the storage unit 2150 may be implemented as an electrically erasable programmable read-only memory (EE- PROM), but the one or more embodiments are not limited thereto. The storage unit 2150 may be implemented by a lower chip.

Referring to FIGS. 16 and 17, in some embodiments, each of the camera modules 2100a, 2100b, and 2100c may include the actuator 2130. Accordingly, the camera modules 2100a, 2100b, and 2100c may respectively include the calibration data 2147 that are the same or different according to the operation of the actuators 2130 included therein.

In some embodiments, one camera module (e.g., camera module 2100b) among the camera modules 2100a, 2100b and 2100c may be a camera module of a folded lens type including the prism 2105 and the OPFE 2110 described above, and the remaining camera modules (e.g., camera modules 2100a and 2100c) may be camera modules of a vertical type, which do not include the prism 2105 and the OPFE 2110. However, the one or more embodiments are not limited thereto.

In some embodiments, one camera module (e.g., camera module 2100c) among the camera modules 2100a, 2100b and 2100c may be a depth camera of a vertical type that extracts depth information using, for example, infrared rays (IR). For example, an application processor 1200 may merge image data provided from the depth camera with image data provided from another camera module (e.g., camera module 2100a or 2100b) to generate a three dimensional (3D) depth image.

In some embodiments, among the camera modules 2100a, 2100b, and 2100c, at least two camera modules (e.g., camera modules 2100a and 2100c) may have different fields of view (viewing angles). For example, among the camera modules 2100a, 2100b, and 2100c, at least two camera modules (e.g., camera modules 2100a and 2100c) may have different optical lenses, but are not limited thereto.

Further, in some embodiments, the camera modules 2100a, 2100b, and 2100c may have different viewing angles. The optical lenses included in the respective camera modules 2100a, 2100b, and 2100c may also be different, but the one or more embodiments are not limited thereto.

In some embodiments, the camera modules 2100a, 2100b, and 2100c may be disposed to be physically separated from each other. That is, the sensing area of one image sensor 2142 is not divided and used by the camera modules 2100a, 2100b, and 2100c, but an independent image sensor 2142 may be disposed inside each of the camera modules 2100a, 2100b, and 2100c.

Referring back to FIG. 16, the application processor 2200 may include an image processing unit 2210, a memory controller 2220, and an internal memory 2230. The application processor 2200 may be implemented separately from the camera modules 2100a, 2100b, and 2100c. For example, the application processor 2200 and the camera modules 2100a, 2100b, and 2100c may be implemented separately as separate semiconductor chips.

The image processing unit 2210 may include a plurality of sub-image processors 2212a, 2212b, and 2212c, an image generator 2214, and a camera module controller 2216.

The image processing unit 2210 may include the sub-image processors 2212a, 2212b, and 2212c, the number of which corresponds to the number of the camera modules 2100a, 2100b, and 2100c.

Image data generated from the respective camera modules 2100a, 2100b, and 2100c may be provided to the corresponding sub-image processors 2212a, 2212b, and 2212c through separate image signal lines ISLa, ISLb, and ISLc respectively. For example, image data generated from the camera module 2100a may be provided to the sub-image processor 2212a through the image signal line ISLa, image data generated from the camera module 2100b may be provided to the sub-image processor 2212b through the image signal line ISLb, and image data generated from the camera module 2100c may be provided to the sub-image processor 2212c through the image signal line ISLc. For example, such image data transmission may be performed using a camera serial interface (CSI) based on a mobile industry processor interface (MIPI), but embodiments are not limited thereto.

In some embodiments, one sub-image processor may correspond to a plurality of camera modules. For example, the sub-image processor 2212a and the sub-image processor 2212c may be integrated into one sub-image processor without being separated from each other as shown in FIG. 16, and image data provided from the camera module 2100a and the camera module 2100c may be selected by a data selector (e.g., multiplexer) or the like, and then provided to the integrated sub-image processor.

The image data provided to each of the sub-image processors 2212a, 2212b, and 2212c may be provided to the image generator 2214. The image generator 2214 may generate an output image using the image data provided from each of the sub-image processors 2212a, 2212b, and 2212c according to image generation information or a mode signal.

Specifically, according to the image generation information or the mode signal, the image generator 2214 may generate an output image by merging at least some of the image data generated from the camera modules 2100a, 2100b and 2100c having different viewing angles. Further, according to the image generation information or the mode signal, the image generator 2214 may generate an output image by selecting any one of image data generated from camera modules 2100a, 2100b and 2100c having different viewing angles.

In some embodiments, the image generation information may include a zoom signal (or zoom factor). Further, in some embodiments, the mode signal may be a signal based on, for example, a mode selected by a user.

When the image generation information is a zoom signal (zoom factor), and the camera modules 2100a, 2100b, and 2100c have different fields of view (viewing angles), the image generator 2214 may perform a different operation depending on the type of the zoom signal. For example, when the zoom signal is a first signal, image data outputted from the camera module 2100a may be merged with image data outputted from the camera module 2100c, and then an output image may be generated using the merged image signal and image data that is outputted from the camera module 2100b not used for merging. When the zoom signal is a second signal that is different from the first signal, the image generator 2214 does not perform the image data merging, but may generate an output image by selecting any one of image data outputted from the camera module 2100a, 2100b, and 2100c. However, the one or more embodiments are not limited thereto, and the method of processing image data may be variously modified as needed.

In some embodiments, the image generator 2214 may receive a plurality of image data having different exposure times from at least one of the sub-image processors 2212a, 2212b, and 2212c, and perform the high dynamic range (HDR) processing on the plurality of image data, thereby generating merged image data with an increased dynamic range.

The camera module controller 2216 may provide a control signal to each of the camera modules 2100a, 2100b, and 2100c. The control signals generated from the camera module controller 2216 may be provided to the corresponding camera modules 2100a, 2100b, and 2100c through the separated control signal lines CSLa, CSLb, and CSLc.

Any one of the camera modules 2100a, 2100b and 2100c may be designated as a master camera (e.g., camera module 2100a) according to the mode signal or the image generation information including the zoom signal, and the remaining camera modules may be designated as slave cameras (e.g., camera modules 2100b and 2100c). Such information may be included in the control signals to be provided to the corresponding camera modules 2100a, 2100b, and 2100c through the separate control signal lines CSLa, CSLb, and CSLc.

The camera modules operating as the master and the slaves may be changed according to the zoom factor or the operation mode signal. For example, when the viewing angle of the camera module 2100a is wider than the viewing angle of the camera module 2100c and the zoom factor indicates a low zoom ratio, the camera module 2100c may operate as a master, and the camera module 2100a may operate as a slave. On the contrary, when the zoom factor indicates a high zoom ratio, the camera module 2100a may operate as a master, and the camera module 2100c may operate as a slave.

In some embodiments, the control signal provided from the camera module controller 2216 to each of the camera modules 2100a, 2100b, and 2100c may include a sync enable signal. For example, when the camera module 2100b is a master camera and the camera modules 2100a and 2100c are slave cameras, the camera module controller 2216 may transmit the sync enable signal to the camera module 2100b. The camera module 2100b having received the sync enable signal may generate a sync signal based on the received sync enable signal, and transmit the generated sync signal to the camera modules 2100a and 2100c through sync signal lines SSL. Based on the sync signal, the camera modules 2100a, 2100b and 2100c may synchronously transmit image data to the application processor 2200.

In some embodiments, the control signal provided from the camera module controller 2216 to the camera modules 2100a, 2100b, and 2100c may include mode information according to the mode signal. Based on the mode information, the camera modules 2100a, 2100b, and 2100c may operate in a first operation mode or a second operation mode in relation to a sensing rate.

In the first operation mode, the camera modules 2100a, 2100b, and 2100c may generate an image signal at a first rate (e.g., first frame rate), and encode it at a second rate (e.g., second frame rate higher than first frame rate) higher than the first rate, and transmit the encoded image signal to the application processor 2200. For example, the second rate may be 30 times or less the first rate.

The application processor 2200 may store the received image signal, that is, the encoded image signal, in the memory 2230 provided therein or in a storage 2400 provided outside the application processor 2200. The application processor 2200 may read out the encoded image signal from the memory 2230 or the storage 2400 to decode it, and display image data generated based on the decoded image signal. For example, a corresponding sub-processor among the sub-image processors 2212a, 2212b, and 2212c of the image processing unit 2210 may perform decoding and may also perform image processing on the decoded image signal. For example, the image data generated based on the decoded image signal may be displayed on the display 2500.

In the second operation mode, the camera modules 2100a, 2100b, and 2100c may generate an image signal at a third rate (e.g., third frame rate lower than first frame rate) lower than the first rate and transmit the image signal to the application processor 2200. The image signal provided to the application processor 2200 may be a signal that is not encoded. The application processor 2200 may perform image processing on the received image signal or store the image signal in the memory 2230 or the storage 2400.

The PMIC 2300 may supply power, such as a source voltage, to each of the camera modules 2100a, 2100b, and 2100c. For example, the PMIC 2300 may supply first power to the camera module 2100a through a power signal line PSLa, second power to the camera module 2100b through a power signal line PSLb and third power to the camera module 2100c through a power signal line PSLc under the control of the application processor 2200.

The PMIC 2300 may generate power corresponding to each of the camera modules 2100a, 2100b, and 2100c in response to a power control signal PCON from the application processor 2200, and may also adjust a power level. The power control signal PCON may include a power adjustment signal for each operation mode of the camera modules 2100a, 2100b, and 2100c. For example, the operation mode may include a low power mode, and the power control signal PCON may include information on a camera module operating in the low power mode and a set power level. Levels of powers provided to the respective camera modules 2100a, 2100b, and 2100c may be the same or different. Further, the levels of powers may be dynamically changed.

The one or more embodiments of the disclosure have been described above, and it should be understood that many variations and modifications can be made to the embodiments of the disclosure without departing from the scope of the present disclosure. The one or more embodiments described above should be understood in a generic and descriptive sense only and should not be construed as limiting the scope of the disclosure.

What is claimed is:

1. A digital pixel sensor comprising:
   a pixel array including a plurality of pixels; and
   a bank disposed on the pixel array, the bank comprising:
   a first comparator disposed on a first pixel of the plurality of pixels and configured to compare a first pixel signal output from the first pixel with a reference signal to output a first comparison result signal;
   a second comparator disposed on a second pixel of the plurality of pixels and configured to compare a second pixel signal output from the second pixel with the reference signal to output a second comparison result signal;
   a third comparator disposed on a third pixel of the plurality of pixels and configured to compare a third pixel signal output from the third pixel with the reference signal to output a third comparison result signal;
   a fourth comparator disposed on a fourth pixel and configured to compare a fourth pixel signal output from the fourth pixel with the reference signal to output a fourth comparison result signal; and
   a counter connected to a plurality of comparators including the first comparator to the fourth comparator, and configured to receive a plurality of comparison signals including the first comparison result signal to the fourth comparison result signal, and latch count code based on the plurality of comparison result signals.

2. The digital pixel sensor of claim 1, wherein the first comparator is directly connected to the first pixel, the second comparator is directly connected to the second pixel, the third comparator is directly connected to the third pixel, and the fourth comparator is directly connected to the fourth pixel.

3. The digital pixel sensor of claim 1, wherein the second pixel is disposed in a first direction from the first pixel,
the third pixel is disposed in a second direction intersecting the first direction from the first pixel, and
the fourth pixel is disposed in the second direction from the second pixel.

4. The digital pixel sensor of claim 3, wherein the second comparator is disposed in the first direction from the first comparator,
the third comparator is disposed in the second direction from the first comparator, and
the fourth comparator is disposed in the second direction from the second comparator.

5. The digital pixel sensor of claim 1, wherein the counter is disposed adjacent to the plurality of comparators.

6. The digital pixel sensor of claim 1, wherein the bank further comprises an asynchronous buffer connected to the counter to transmit the count code to the counter.

7. The digital pixel sensor of claim 6, wherein the asynchronous buffer is disposed adjacent to the counter, the first comparator, and the third comparator.

8. A digital pixel sensor comprising:
a pixel array including a first pixel configured to output a first pixel signal and a second pixel configured to output a second pixel signal different from the first pixel signal; and
a bank disposed on the pixel array, the bank comprising:
a first comparator configured to perform analog signal processing on the first pixel signal to output a first analog signal;
a second comparator configured to perform digital signal processing on the first analog signal to output a first comparison result signal;
a third comparator configured to perform the analog signal processing on the second pixel signal to output a second analog signal;
a fourth comparator configured to perform the digital signal processing on the second analog signal to output a second comparison result signal; and
a counter configured to latch count code based on the first comparison result signal and the second comparison result signal,
wherein the first comparator to the fourth comparator are disposed in a first direction, and the counter is disposed adjacent to the first comparator to the fourth comparator in a second direction intersecting the first direction.

9. The digital pixel sensor of claim 8, wherein the pixel array includes a third pixel configured to output a third pixel signal and a fourth pixel configured to output a fourth pixel signal,
the third pixel signal is different from the first pixel signal and the second pixel signal, and
the fourth pixel signal is different from the first pixel signal, the second pixel signal and the third pixel signal.

10. The digital pixel sensor of claim 9, wherein the bank further comprises a fifth comparator and a sixth comparator spaced apart from the first comparator to the fourth comparator in the second direction and arranged in the first direction,
the fifth comparator performs signal processing on the third pixel signal to output a third comparison result signal,
the sixth comparator performs the signal processing on the fourth pixel signal to output a fourth comparison result signal, and
the counter latches the count code based on the third comparison result signal and the fourth comparison result signal.

11. The digital pixel sensor of claim 10, wherein the fifth comparator and the sixth comparator are disposed adjacent to the counter in the second direction.

12. The digital pixel sensor of claim 10, wherein the bank further comprises a buffer disposed adjacent to the first comparator, the fifth comparator, and the counter, and configured to transmit the count code to the counter.

13. The digital pixel sensor of claim 12, wherein the buffer transmits the latched count code to an external device.

14. The digital pixel sensor of claim 8, wherein the counter comprises a first memory configured to latch the count code based on the first comparison result signal and a second memory configured to latch the count code based on the second comparison result signal,
the first memory latches the count code based on a reset component of the first comparison result signal, and
the second memory latches the count code based on an image signal component of the first comparison result signal.

15. The digital pixel sensor of claim 14, wherein the first memory is disposed adjacent to the first comparator to the fourth comparator, and
the second memory is disposed to be spaced apart from the first comparator to the fourth comparator.

16. An analog digital converter comprising:
a comparator configured to compare a reference signal with a pixel signal output from a pixel and output a comparison result signal;
a count code generator configured to receive a code generation clock signal from a clock signal generator, and output first count code and second count code according to the code generation clock signal;
a first memory configured to latch the first count code based on a reset component of the comparison result signal during a first time period; and
a second memory configured to latch the second count code based on an image signal component of the comparison result signal during a second time period subsequent to the first time period,
wherein during a third time period subsequent to the second time period, the first count code is read from the first memory, and
during a fourth time period subsequent to the third time period, the second count code is read from the second memory.

17. The analog digital converter of claim 16, further comprising a line memory in which the first code read from the first memory and the second count code read from the second memory are stored.

18. The analog digital converter of claim 16, wherein the latched first count code is not read from the first memory between the first time period and the second time period.

19. The analog digital converter of claim 16, wherein a storage capacity of the first memory is smaller than a storage capacity of the second memory.

20. The analog digital converter of claim 16, further comprising an asynchronous buffer connected to the first memory and the second memory and configured to transmit the first count code and the second count code to the first memory and the second memory.

21. A digital pixel sensor comprising:
   a pixel array including a plurality of pixels; and
   a bank disposed on the pixel array, the bank comprising:
      a plurality of comparators disposed on the plurality of pixels and configured to compare each of a plurality of pixel signals output from the plurality of pixels with a reference signal to output a plurality of comparison result signals; and
      a counter connected to the plurality of comparators, and configured to receive the plurality of comparison result signals and latch count code based on the plurality of comparison result signals.

\* \* \* \* \*